United States Patent
Tikhonov

[11] Patent Number: 6,033,994
[45] Date of Patent: Mar. 7, 2000

[54] APPARATUS AND METHOD FOR DEPROCESSING A MULTI-LAYER SEMICONDUCTOR DEVICE

[75] Inventor: Victor Tikhonov, San Antonio, Tex.

[73] Assignees: Sony Corporation, Tokyo, Japan; Sony Electronics, Inc., Park Ridge, N.J.

[21] Appl. No.: 08/857,834

[22] Filed: May 16, 1997

[51] Int. Cl.[7] .................... H01L 21/302; C23F 1/02; B08B 6/00

[52] U.S. Cl. .................... 438/746; 156/345; 216/90; 134/1.3

[58] Field of Search .................... 134/1.3, 1, 51; 156/345; 216/90; 438/746

[56] References Cited

U.S. PATENT DOCUMENTS

| | | | |
|---|---|---|---|
| 4,957,583 | 9/1990 | Buck | 156/345 |
| 5,214,283 | 5/1993 | Le | 250/307 |
| 5,379,785 | 1/1995 | Ohmori et al. | 134/184 |
| 5,470,393 | 11/1995 | Fukazawa | 134/3 |
| 5,475,251 | 12/1995 | Kuo et al. | 287/316 |
| 5,498,871 | 3/1996 | Koo et al. | 250/307 |
| 5,523,058 | 6/1996 | Umemura et al. | 422/128 |
| 5,715,851 | 2/1998 | Jung et al. | 134/155 |

FOREIGN PATENT DOCUMENTS

| | | |
|---|---|---|
| 54-004071 | 1/1979 | Japan. |
| 58-145126 | 8/1983 | Japan. |
| 3-285381 | 12/1991 | Japan. |
| 5-152277 | 6/1993 | Japan. |
| 2302987 | 2/1997 | United Kingdom. |

*Primary Examiner*—Benjamin L. Utech
*Assistant Examiner*—George Goudreau
*Attorney, Agent, or Firm*—Rader, Fishmand & Grauer; Ronald P. Kananen

[57] ABSTRACT

An improved method of deprocessing semiconductor chips provides faster, more accurate and more complete deprocessing. The chip to be deprocessed is placed in a chemical agent to loosen or undercut layers of material to be removed. A physical impact or series of impacts is then delivered to the chip, for example, by a compression wave transmitted through a fluid medium. The impact will cause chemically loosened or undercut material to break loose from the chip. The amount of time between when the chip is placed in the chemical agent and when the impact occurs, and the power and duration of the impact can be controlled to determine what layer of the chip structure will be exposed by the deprocessing.

14 Claims, 1 Drawing Sheet

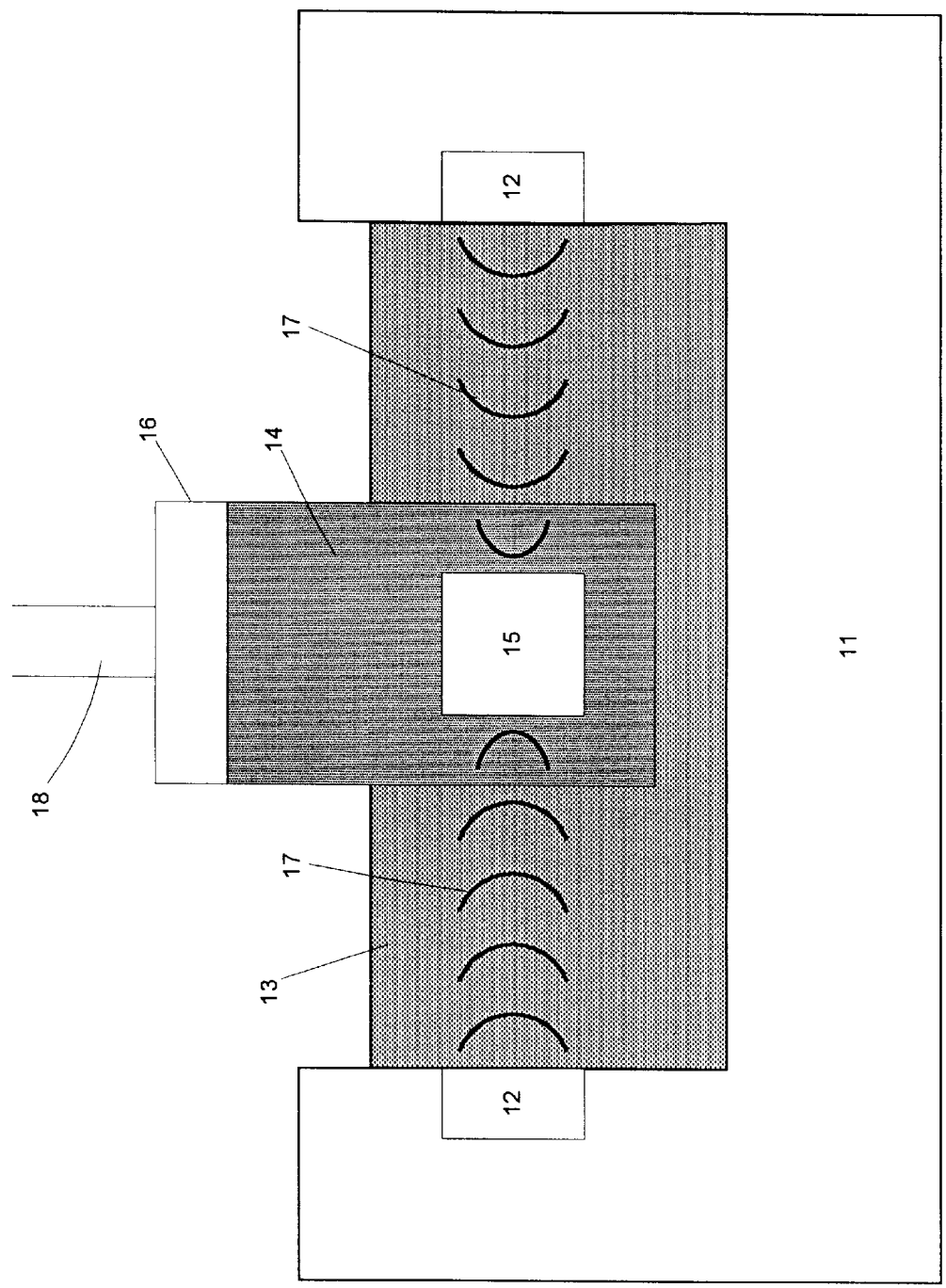
Figure

6,033,994

APPARATUS AND METHOD FOR DEPROCESSING A MULTI-LAYER SEMICONDUCTOR DEVICE

FIELD OF THE INVENTION

The present invention relates generally to the field of semiconductor device manufacture and failure analysis. More specifically, the present invention relates to the field of chemically removing layers of deposited material from multi-layer structures on semiconductor substrates to expose problem sections during failure analysis.

BACKGROUND OF THE INVENTION

In the world of modern technology, electronic circuits and circuit elements formed on semiconductor chips are ubiquitous. A semiconductor chip may be found controlling a battery-powered toy, a home stereo or a computerized fuel injection system.

Semiconductor chip technology allows circuits to be miniaturized because microscopic circuit elements and electrical connections between those elements can be formed directly on the chip. This process typically includes successively depositing layers of different materials on the semiconductor chip that are needed to form connections and circuit elements. After a single layer or several layers are deposited, much of the deposited material is chemically removed from the chip, leaving material behind only in those places where it is used to form a circuit element or electrical connection.

Because semiconductor chips are mass-produced, when a defect in the layered structure is discovered causing a circuit element on the chip to function improperly or not at all, the cause of the problem must be determined and corrected or it is likely to recur in subsequent chips. Accordingly, a method known as deprocessing is employed.

In deprocessing, the layers of material that have been deposited on the semiconductor chip are chemically or mechanically removed, or chemically undercut and removed, one by one until the area or layer which is suspected of or known to be causing the problem is exposed for inspection. By inspecting the exposed layer with an optical, laser, scanning, electron or other suitable microscope, the cause of the problem can often be visually determined. Microphotographs can also be taken to determine whether the visual defect is indeed the cause of the device failure.

In the prior art, deprocessing is typically performed by placing the chip to be deprocessed in a bath containing a chemical deprocessing agent in liquid form. The chemical deprocessing agent is usually an acid or mixture of acids capable of removing, i.e., dissolving or undercutting, layer (s) of material deposited on the chip. The chip is then removed from the solution for inspection of the exposed, suspect layer.

While deprocessing is a valuable technique in the failure analysis of semiconductor chips, it has at least three principle drawbacks. The first is the amount of time required for deprocessing. It can take hours for the chemical processing to remove the unwanted layers of material.

The second drawback contributes to the first in that, in order to monitor the progress of the deprocessing so that the process is stopped at the layer to be inspected, the deprocessing must be interrupted periodically so that the chip can be inspected and the deprocessing monitored. Otherwise, the layer to be inspected may itself by removed by the deprocessing. This monitoring obviously adds to the time required for deprocessing.

The third drawback is that the chemical removal of layers of material from the semiconductor chip may be uneven. Thus, islands of material from the layer above the suspect or problem layer may remain after deprocessing. This obstructs inspection of the problem layer. Alternatively, such islands of material from the layer above the problem layer, when removed, may take part of the problem layer with them, thereby by ruining the sample.

Accordingly, there is a need for an improved deprocessing apparatus and method that overcomes these drawbacks. Specifically, there is a need for an improved deprocessing apparatus and method that more quickly, accurately, and completely removes unwanted layers of material to expose the layer that needs to be inspected.

OBJECTS OF THE INVENTION

Accordingly it is an object of the present invention to meet the above-described needs and others. It is an object of the present invention to provide an apparatus and method of deprocessing a semiconductor chip that is less time consuming, requires less monitoring, and removes layers more completely and evenly than is possible with prior art devices and processes.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve the stated and other objects of the present invention, as embodied and described below, the invention may encompass a device for deprocessing semiconductor chips having: a wet sink for containing a bath of a hydraulic fluid; and at least one compression wave emitter disposed in the wet sink for causing a compression wave in the hydraulic fluid contained in the wet sink.

The device of the present invention may also include a container containing a corrosive chemical agent in which a semiconductor chip to be deprocessed may be placed. The container may be at least partially immersed in the hydraulic fluid and allows the compression wave to propagate from the hydraulic fluid to the corrosive chemical agent to impact the semiconductor chip. The compression wave may have an ultrasonic frequency.

The device of the present invention may also include two compression wave emitters as the at least one compression wave emitter. The two emitters may be disposed on opposite sides of the wet sink. The compression wave emitter(s) may also include a control device by which the amplitude of the compression wave may be controlled.

The present invention also encompasses a device for deprocessing a semiconductor chip having: a chemical agent which loosens or undercuts material deposited on the chip; a mechanical shock device which generates a mechanical shock; and a medium which transmits the mechanical shock from the mechanical shock device to the chip to cause the loosened or undercut material to break free of the chip.

The present embodiment of the invention may also have a control device connected to the mechanical shock device that controls the magnitude of the mechanical shock. The mechanical shock may be a series of shocks, the series having an ultrasonic frequency.

The present invention also encompasses a method of deprocessing semiconductor chips by applying, for a certain period of time, a mechanical shock to a semiconductor chip on which deposited material has been loosened or undercut by a chemical agent to cause the loosened or undercut material to break away from the chip.

The method of the present invention may further include controlling the magnitude of the mechanical shock in accordance with a predetermined amount of the deposited material to be removed from the chip; and controlling the amount of time the chip is exposed to the chemical agent before and after the application of the mechanical shock, where the amount of time in either case is controlled in accordance with a predetermined amount of the deposited material to be removed from the chip.

In the present method, the loosening or undercutting material deposited on the semiconductor chip may be accomplished by placing the chip in a container containing a corrosive chemical agent for a certain period of time.

The application of a mechanical shock in the present method may be accomplished by: emitting at least one compression wave which propagates through a bath of a hydraulic fluid in a wet sink; and, at least partially, immersing the container holding the chip and corrosive chemical agent in the bath of hydraulic fluid in the wet sink for a certain period of time.

BRIEF DESCRIPTION OF THE DRAWING

The accompanying drawing illustrates the present invention and is a part of the specification. Together with the following description, the drawing demonstrates and explains the principles of the present invention.

The FIGURE illustrates a deprocessing apparatus of the present invention.

DETAILED DESCRIPTION OF THE PREFERRED EMBODIMENT

According to the principles of the present invention, method and apparatus for an improved deprocessing technique will be disclosed. The present invention facilitates failure analysis of semiconductor chips by providing deprocessing of a chip which is faster, more accurate and more complete that prior art deprocessing.

As shown in the FIGURE, a semiconductor chip 15 is deprocessed by placing it in a container 16 filled with a chemical agent 14 for directly removing or undercutting and removing the layers of material deposited on the chip 15. The chemical agent 14 is, for example, hydrofluoric acid.

According to the principles of the invention, the time required for deprocessing the chip 15 can be greatly reduced if a mechanical shock or a series of mechanical shocks are caused to impact on the chip 15 in conjunction with the immersion of the chip 15 in the chemical agent 14. The impact of the shock or shocks assists in freeing material on the chip 15 that has been loosened or undercut by the chemical agent 14. In this manner, the unwanted material is removed from the chip 15 at a much faster rate than occurs with chemical deprocessing alone.

To implement this aspect of the invention, in a preferred embodiment, the container 16 is at least partially immersed in a hydraulic fluid 13, for example, water, in a wet sink 11 as shown in the FIGURE. On either side of the wet sink 11, are ultrasonic wave emitters 12 which create ultrasonic compression waves 17 which propagate in the medium of the hydraulic fluid 13.

The compression waves 17 propagate through the hydraulic fluid 13, through the sides of container 16, through the chemical agent 14 and impact on the semiconductor chip 15. The concussion of the compression waves 17 impacting on the chip 15 and the resulting vibrations increase the rate of deprocessing.

As noted, the force of the impact may cause an unwanted layer which is being chemically undermined or chemically loosened to break away from the semiconductor chip 15. The force of the impact may also cause separation between the layers of material deposited on the chip 15, thereby preventing the formation of islands of unwanted material that are not removed by the chemical agent 14.

The combined use of chemical deprocessing and mechanical shock can accordingly increase the speed and completeness of deprocessing. As in the prior art, the deprocessing may still need to be halted periodically to monitor the amount of material removed from chip 15 and to determine the amount of remaining material yet to be removed in order to expose the layer to be inspected.

While the present invention may be practiced as described above to decrease processing time, a further principle of the invention may be invoked to more accurately deprocess the chip 15 to a desired level for inspection without the need to frequently halt the deprocessing to inspect the chip 15. By controlling the amount of time the chip 15 is exposed to the chemical agent 14 before and after being struck with the mechanical shock(s), e.g., ultrasonic compression waves 17, and by controlling the force or power of the shock(s), e.g. the amplitude of the compression waves 17, the layer of the chip 15 that will be exposed following the impact of the compression waves 17 can be controlled with reasonable accuracy and repeatability.

The amount of time the chip 15 is exposed to the chemical agent 14 before a shock is applied may be controlled in at least two ways. For example, the compression wave emitters 12 may be made inactive until the desired amount of time has passed. Alternatively, the container 16 holding chemical agent 14 and chip 15 may not be immersed in the hydraulic fluid 13 and exposed to compression waves 17 until the desired amount of time has passed.

The power or force of the compression waves 17 may also be controlled in at least two ways. The first method is by adjusting the structure of and input power to the wave emitters 12. The alternative method is by adjusting the depth at which container 16 is immersed in liquid 17.

Container 16 will be supported by a movable support 18. With movable support 18, the depth to which container 16 is immersed in fluid 13 may be controlled. By adjusting the immersion depth, the amount of surface area of container 16 which is struck by the compression waves 17 and, hence, the power of the compression wave transmitted to liquid 14 and, ultimately, chip 15 can be controlled.

Thus, to advantageously control the deprocessing according to the present invention, the amount of time the chip 15 is exposed to the chemical agent 14 before and after being struck with the mechanical shock, and the force or power of the shock must be determined. Determining and adjusting these important variables in this manner, given the principles of the invention, is well within the ambit of one skilled in the art.

However, because of the many additional variables involved, including variation in the layer to be exposed for inspection, it is not possible to mathematically calculate the necessary pre-shock or post-shock exposure time to the chemical agent 14 and the appropriate force and duration of the shock necessary to expose the desired material layer. Rather, one of skill in the art must experiment with samples of the mass-produced chips 15 to be deprocessed in the particular deprocessing equipment being used in order to determine these variables. This experimentation is the only method known in the art to determine these variables.

However, once the pre-shock and post-shock chemical processing time and the shock force are determined for a particular layer to be inspected on a particular type of chip 15, deprocessing to that layer can be effected more quickly and efficiently than with any prior art device or method. For example, in an experiment performed by the inventor, a deprocessing which, using the prior art, would have taken approximately an hour was accomplished with greater accuracy in approximately 20 seconds.

It should be noted that other methods of delivering a mechanical shock or shocks to the chip 15 may be apparent to those skilled in the art and are within the scope of the present invention. The method illustrated in the FIGURE is merely the best mode contemplated by the inventor. Equivalent methods will be readily conceived by those skilled in the art within the principles of the present invention.

The preceding description has been presented only to illustrate and describe the invention. It is not intended to be exhaustive or to limit the invention to any precise form disclosed. Many modifications and variations are possible in light of the above teaching. The preferred embodiment was chosen and described in order to best explain the principles of the invention and its practical application.

The preceding description is intended to enable others skilled in the art to best utilize the invention in various embodiments and with various modifications as are suited to the particular use contemplated. It is intended that the scope of the invention be defined by the following claims.

What is claimed is:

1. A device for deprocessing semiconductor chips comprising:
   a wet sink for containing a bath of a hydraulic fluid;
   at least one compression wave emitter disposed in said wet sink for causing a compression wave in said hydraulic fluid contained in said wet sink; and
   a container containing a corrosive chemical agent in which a semiconductor chip to be deprocessed is placed, said corrosive chemical agent being effective to loosen or undercut material deposited on said semiconductor chip that forms semiconductor structures on said chip;
   wherein said container containing said corrosive chemical agent is at least partially immersed in said hydraulic fluid and allows said compression wave to propagate from said hydraulic fluid to said corrosive chemical agent to impact said semiconductor chip; and
   wherein said at least one compression wave emitter emits said compression wave with sufficient amplitude to dislodge said material deposited on said semiconductor chip and loosened or undercut by said corrosive chemical agent.

2. A device as claimed in claim 1, wherein said compression wave has an ultrasonic frequency.

3. A device as claimed in claim 1, wherein said at least one compression wave emitter further comprises two compression wave emitters disposed on opposite sides of said wet sink.

4. A device as claimed in claim 1, wherein said at least one compression wave emitter further comprises a control device by which the amplitude of said compression wave may be controlled.

5. A device as claimed in claim 1, further comprising means for controlling an amount by which said container is immersed in said hydraulic fluid in accordance with a desired amount of energy of said compression wave to be transmitted to a semiconductor chip in or mechanically coupled to said hydraulic fluid.

6. A method of deprocessing semiconductor chips comprising applying a mechanical shock to a semiconductor chip, on which deposited material has been loosened or undercut by a chemical agent, to cause said loosened or undercut material to break away from said chip said mechanical shock having sufficient energy to cause said loosened or undercut material to break away from said chip.

7. A method as claimed in claim 6, further comprising controlling the magnitude and duration of said mechanical shock in accordance with an amount of said deposited material to be removed from said chip.

8. A method as claimed in claim 6, further comprising controlling the amount of time said chip is exposed to said chemical agent before said applying of a mechanical shock, wherein said amount of time is controlled in accordance with an amount of said deposited material to be removed from said chip.

9. A method as claimed in claim 6, further comprising controlling the amount of time said chip is exposed to said chemical agent after said applying of a mechanical shock, wherein said amount of time is controlled in accordance with an amount of said deposited material to be removed from said chip.

10. A method as claimed in claim 6, wherein said method further comprises loosening or undercutting material deposited on said semiconductor chip by placing said chip in a container containing a corrosive chemical agent.

11. A method as claimed in claim 10, wherein said applying a mechanical shock comprises:
    emitting at least one compression wave which propagates through a bath of a hydraulic fluid in a wet sink; and,
    at least partially, immersing said container in said bath of hydraulic fluid in said wet sink.

12. A method as claimed in claim 11, wherein said compression waves have an ultrasonic frequency.

13. A method as claimed in claim 11, further comprising controlling an amount by which said container is immersed in said bath of hydraulic fluid in accordance with a desired magnitude of said mechanical shock.

14. A method as claimed in claim 13, wherein said applying a mechanical shock comprises emitting at least one ultrasonic compression wave as said mechanical shock, wherein said compression wave propagates through said bath of a hydraulic fluid.

* * * * *